PIEZOELECTRIC LEAD ZIRCONATE TITANATE CONTAINING RHODIUM
Filed Feb. 5, 1965
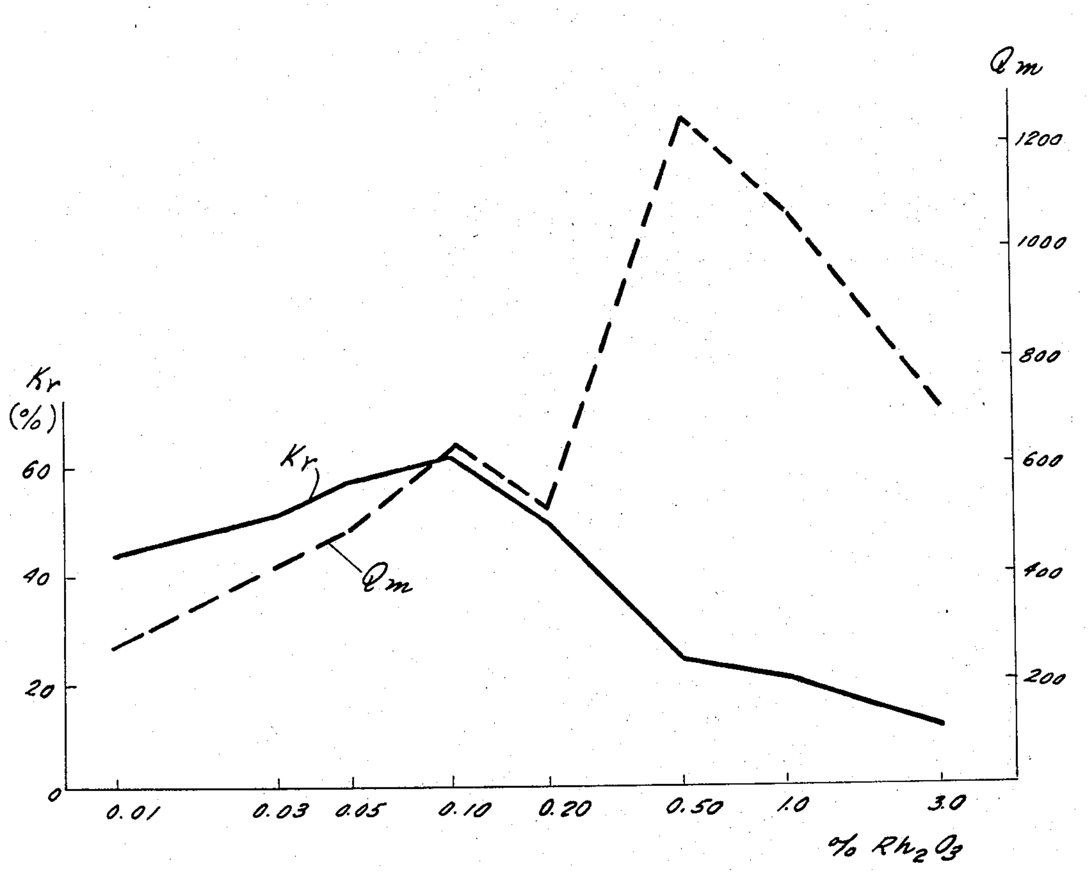
INVENTORS
TSUNEO AKASHI
MASAO TAKAHASHI
FUMIO YAMAUCHI
NORIO TSUBOUCHI
TOMEJI OHNO
OSTROLENK, FABER, GERB & SOFFEN
ATTORNEYS 3,375,194

PIEZOELECTRIC LEAD ZIRCONATE TITANATE CONTAINING RHODIUM

Tsuneo Akashi, Masao Takahashi, Fumio Yamauchi, Norio Tsubouchi, and Tomeji Ohno, Tokyo, Japan, assignors to Nippon Electric Company Limited, Tokyo, Japan Filed Feb. 5, 1965, Ser. No. 430,550
Claims priority, application Japan, Feb. 13, 1964, 39/7,525
3 Claims. (Cl. 252—62.9)

ABSTRACT OF THE DISCLOSURE

A lead zirconate titanate piezoelectric ceramic containing 0.01 to 1.0 weight percent of rhodium sesquioxide in solid solution. The rhodium sesquioxide causes the lead zirconate titanate to assume extremely high electromechanical coupling and mechanical quality factors.

The instant invention relates to piezoelectric devices and more particularly to a novel piezoelectric ceramic composition exhibiting extremely high electromechanical coupling and mechanical quality factors when used as a transducer element and for exhibiting extremely high mechanical quality factors and any desired value of electromechanical coupling factor over a wide range of values when employed as a ceramic filter element.

With respect to piezoelectric ceramic materials having a basic composition of lead titanate zirconate ceramics and in which rhodium sesquioxide is contained in varying amounts ranging from 0.01 to 1.0% by weight, it is a prime object of the instant invention to improve both the electromechanical coupling factor and the mechanical quality factor of such piezoelectric ceramic compositions and notably to improve the latter factor.

It is well known that when a solid solution of lead titanate zirconate $Pb(Ti.Zr)O_3$ is prepared by mixing lead titanate ($PbTiO_3$) and lead zirconate ($PbZrO_3$) and sintering the mixture, a piezoelectric ceramic material is produced, which exhibits strong piezoelectric properties. The high stability and durability are obtained under ambient temperature conditions and, in particular, the highest degree of piezoelectricity is exhibited when the subscript $x$ associated with the component symbols in the compositional formula $Pb(Ti_xZr_{1-x})O_3$ ranges from 0.47 to 0.48.

The two fundamental criteria in evaluating the merits and demerits of piezoelectric ceramic materials are the electromechanical coupling factor and the mechanical quality factor. The former is indicative of the conversion efficiency in converting mechanical oscillations into oscillating electrical energy and vice versa, while the latter is indicative of the degree of the magnitude of energy to be expanded within a piezoelectric ceramic material in course of such conversion, wherein the larger the magnitude of the mechanical quality factor, the less being the expended energy.

In recent years, ceramic filters employing piezoelectric ceramics as elements thereof and mechanical filters using the such ceramics as transducers elements have come into prominence due to their numerous meritorious characteristics.

The characteristics of piezoelectric ceramic materials desirable for their applications must fulfill the following conditions:

As one primary qualification for ceramic filter elements, the electromechanical coupling factor must be capable of taking any desired value in a wide range of values from an extremely small to an extremely large value while the mechanical quality factor should have as large a value as possible. In order to suitably qualify for use as a transducer element, both of the above factors should have as large a value as possible.

In other words, the characteristics called for by transducer elements should conform to the characteristics called for by materials capable of assuming a large value of the electromechanical coupling factor among the characteristics required for ceramic filter elements.

Although the basic composition of piezoelectric ceramics contemplated by this invention is lead titanate zirconate, it can be reasonably surmised from the publications subsequently mentioned herein below that the addition of rhodium sesquioxide to the ceramic material is equally efficacious even if 23% or less by weight of the lead employed in the ceramic material has been substituted for by at least one of the ingredients taken from the group consisting of calcium, strontium, and barium, and/or 65% or less by atom weight of the total amounts of titanium and zirconium has been substituted for by tin.

Is should be understood therefore that the term "lead titanate zirconate" as used hereinafter is intended to encompass not only the true significance of the term, but also one in which a portion of the lead has been replaced by at least one of the ingredients taken from the group consisting of calcium, strontium, and barium and/or a part of titanium and zirconium has been replaced by tin. (Details of these substitutions are disclosed in a treatise B. Jaffe, R. S. Roth, and S. Marzullo appearing in "Journal of Research of the National Bureau of Standards," 55 (1955), p. 239, as well as in Japanese Patent Gazette No. 10076, 1963 (corresponding U.S. Patent 3,068,177).)

It is therefore one object of the instant invention to provide a novel piezoelectric ceramic material comprised of lead titanate zirconate to which is added a predetermined amount of rhodium sesquioxide for significantly improving the electromechanical coupling and mechanical quality factors of the resultant piezoelectric ceramic.

Another object of the instant invention is to provide a novel piezoelectric ceramic material comprised of lead titanate zirconate to which a rhodium compound such as rhodium oxide or other rhodium salts is added in a measured amount in order to significantly improve the electromechanical coupling and mechanical quality factors of the resultant piezoelectric ceramic.

Still another object of the instant invention is to provide a novel piezoelectric ceramic material comprised of lead titanate zirconate to which is added a predetermined amount of rhodium sesquioxide for significantly improving the electromechanical coupling and mechanical quality factors of the resultant piezoelectric ceramic and wherein a portion of the lead in the range from 0 to 23% by atomic weight may be substituted for by at least one of the ingredients taken from the group consisting of calcium, strontium, and barium.

Another object of the instant invention is to provide a novel piezoelectric ceramic material comprised of lead titanate zirconate to which is added a predetermined amount of rhodium sesquioxide for significantly improving the electromechanical coupling and mechanical quality factors of the resultant piezoelectric ceramic and wherein a portion of the total amounts of titanium and zirconium within the range from 0 to 65% by atomic weight has been substituted for by tin.

These and other objects of the instant invention will become apparent when reading the accompanying description and drawing in which:

The sole figure shows the typical curves relating the piezoelectric properties of the novel piezoelectric ceramic compositions as compared with the varying proportions of rhodieum sesquioxide added thereto.

The instant invention is primarily concerned with piezoelectric ceramics having the compositional formula $Pb(Zr_xTi_ySn_z)O_3$, wherein the $x$, $y$ and $z$ terms represent the mole fractions of the respective component symbols and have the numerical values:

$x$=0.00–0.90
$y$=0.10–0.60
$z$=0.00–0.65 where $x+y+z=1$ and if required, 0–23% by atomic weight of lead may be substituted for by at least one of the elements taken from the group comprised of calcium, strontium, and barium, and containing from 0.01 to 1.0% by weight of rhodium sesquioxide ($Rh_2O_3$) as an additive agent.

It will be evident that the effect of improvements in piezoelectric properties due to the addition of rhodium sesquioxide is caused by the presence of rhodium ions in the lead titanate zirconate. For this reason, there is no objection for adding a dhodium compound such as a rhodium salt for example, rhodium dioxide in lieu of the rhodium sesquioxide, provided that such a compound contains the amount of rhodium ions equal to that contained in the rhodium sesquioxide.

The annexed drawing shows the variation of the electromechanical coupling factor in radial made oscillations (symbol Kr is used hereinafter) and the mechanical quality factor (symbol Qm is used hereinafter) of lead titanate zirconate having the compositional formula $Pb(Zr_{0.62}Ti_{0.52})O_3$ for variations in the amount of rhodium sesquioxide as an additive agent.

It will be evident from these curves that no notable effects occur when the amount of rhodium sesquioxide added is less than 0.01% by weight while Kr is markedly decreased, assuming a two-phase composition instead of a homogeneous composition when the amount of rhodium sesquioxide added is in excess of 1.0% by weight. The most appropriate amount for addition of rhodium sesquioxide may be said to range from 0.01 to 1.0 weight percent.

The invention will now be described in detail with reference to several embodiments.

*Embodiment 1*

Starting initially with lead titanate zirconate having the basic compositional formula $Pb(Zr_{0.52}Ti_{0.48})O_3$ and consisting of 50 mole precent lead monoxide, 26 mole percent zirconium dioxide, and 24 mole percent titanium dioxide, rhodium sesquioxide was added in amounts corresponding to 0.01% by weight of the total weight of the composition. Then the material was pulverized and mixed in a ball mill. The mix was presintered for one hour at 900° C. After pulverizing the presintered product, the resultant material was substantially pressed into disk form and subjected to sintering process for one hour at 1300° C. Silver electrodes were coated on the opposite sides of the disk and the disk was subjected to a polarizing process for one hour with a D.C. voltage of 50 kv./cm, applied across the electrodes at room temperature. Then the ultimate product was left standing in air for 24 hours.

The values of Kr and Qm of the piezoelectric ceramic material having the composition $Pb(Zr_{0.62}Ti_{0.48})O_3$ plus 0.01 weight percent $Rh_2O_3$ were found to be 44% and 270, respectively.

The values of Kr and Qm of the corresponding product of plain lead titanate zirconate (that is, containing no additive agent) $Pb(Zr_{0.52}Ti_{0.48})O_3$ were 41% and 270, respectively.

A comparison of the results shows that Kr according to this embodiment has increased to some degree.

It should be understood that any one of the succeeding embodiments indicates the result of a piezoelectric ceramic product that was subjected to the same process as recited in the previous example and the values of Kr and Qm for each succeeding embodiment are each compared with those of plain lead titanate zirconate:

*Embodiment 2*

With a piezoelectric ceramic having the compositional formula $Pb(Zr_{0.52}Ti_{0.48})O_3$ addition of 0.03% by weight of $Rh_2O_3$, the values of Kr and Qm were found to be 51% and 420, respectively. For this embodiment, it can clearly be seen that both Kr and Qm have become larger than those of plain lead titanate zirconate and that an excellent piezoelectric ceramic both as the ceramic filter and transducer element can be realized.

*Embodiment 3*

With a piezoelectric ceramic having the formula $Pb(Zr_{0.52}Ti_{0.48})O_3$ addition of 0.05% by weight of the $Rh_2O_3$, the values of Kr and Qm were 57% and 480, respectively. It will be evident from a comparison of the values obtained that both Kr and Qm have increased over those of plain lead titanate zirconate as well as over the associated values for Embodiment 2.

*Embodiment 4*

With a piezoelectric ceramic having the formula $Pb(Zr_{0.52}Ti_{0.48})O_3$ addition of 0.10% by weight of $Rh_2O_3$, the values of Kr and Qm were 62% and 630, respectively.

Obviously, both Kr and Qm have been improved outstandingly as compared with those of plain lead titanate zirconate. The piezoelectric ceramic material according of Embodiment 4 provides excellent characteristics enabling the material to be applied as a transducer element or, when a high value of Kr is required, as a ceramic filter element.

*Embodiment 5*

A piezoelectric ceramic material having the formula $Pb(Zr_{0.52}Ti_{0.48})O_3$ addition of 0.20% by weight of $Rh_2O_3$ exhibits the values of Kr and Qm amounting as high as 50% and 520, respectively. Obviously, the values of Kr and Qm have been improved markedly as compared with those for plain lead titanate zirconate. The piezoelectric ceramic of Embodiment 5 provides a ceramic filter material having excellent caracteristics whenever a Kr of this order is desired.

*Embodiment 6*

With a piezoelectric ceramic material having the formula $Pb(Zr_{0.52}Ti_{0.48})O_3$ addition of 0.5% by weight of $Rh_2O_3$, the values of Kr and Qm were 24% and 1240, respectively. As compared with the piezoelectric ceramic containing no additive agent, Kr is decreased while Qm is increased markedly. The material according to this embodiment provides an excellent piezoelectric ceramic when a large value of Qm and Kr of the order of 20–30%, or comparatively small values of Kr, are required for a ceramic filter element.

*Embodiment 7*

With a piezoelectric ceramic having the formula $Pb(Zr_{0.52}Ti_{0.48})O_3$ addition of 1.0% by weight of $Rh_2O_3$, the values of Kr and Qm were 21% and 1075, respectively. According to this embodiment, Qm has been improved greatly. This material yields excellent results when a high value of Qm and a comparatively small value of Kr is required.

*Embodiment 8*

With a piezoelectric ceramic having the Zr to Ti ratio of 53 to 47 and containing 0.20 weight percent rhodium sesquioxide—that is, one having the formula $Pb(Zr_{0.53}Ti_{0.47})O_3$ addition of 0.20% by weight of $Rh_2O_3$, the values of Kr and Qm were 53% and 490, respectively. On comparing these values with those of Embodiment 5, it is noted that Kr is slightly decreased and Qm is slightly increased, but the difference is small in either case. This demonstrates the fact that the characteristics are not materially affected in spite of changes of this degree in the basic composition.

*Embodiment 9*

A piezoelectric ceramic material having the formula $Pb(Zr_{0.54}Ti_{0.46})O_3$ having an addition of 0.20% by weight of $Rh_2O_3$—that is, one in which the ratio of Zr to Ti is 54 to 46 and 0.20% by weight of rhodium sesquioxide has been added, the values of Kr and Qm were 52% and 560, respectively. In comparison with Embodiment 5, it is readily noted that both Kr and Qm have been increased slightly. This shows the fact that in spite of changes in the basic composition of this order, Kr does not materially change while Qm retains a large value.

It can clearly be seen from the foregoing that the instant invention provides a novel piezoelectric ceramic material having an electromechanical coupling factor and a mechanical quality factor which is vastly superior as compared with present day piezoelectric materials, which are employed for either electrical filter or transducer applications, which superior results are obtained through the addition of either rhodium sesquioxide or a rhodium compounds such as rhodium salt which contains rhodium ions in amount equal to that contained in rhodium sesquioxide.

Although there has been described a preferred embodiment of this novel invention, many variations and modifications will now be apparent to those skilled in the art. Therefore, this invention is to be limited, not by the specific disclosure herein, but only by the appending claims.

The embodiments of the invention in which an exclusive privilege or property is claimed are defined as follows:

1. A piezoelectric ceramic material having the compositional formula $Pb(Zr_xTi_ySn_z)O_3$, wherein $x$, $y$, and $z$ represent the mole fractions of the respective component symbols and having the numerical values:

$x$=0.00–0.90
$y$=0.10–0.60
$z$=0.00–0.65
$x+y+z=1$ and further containing an additive of from 0.01 to 1.0% by weight of rhodium sesquioxide.

2. The ceramic material of claim 1 wherein up to 23% by weight of the lead (Pb) is substituted for by one of the elements of the group consisting of calcium, strontium, and barium.

3. The piezoelectric ceramic material of claim 1 wherein the quantities $x$, $y$ and $z$ are preferably equal to 0.52, 0.48 and zero, respectively.

References Cited

UNITED STATES PATENTS 3,268,453 8/1966 Ouchi et al. -------- 252—62.9

TOBIAS E. LEVOW, *Primary Examiner.*

ROBERT D. EDMONDS, *Examiner.*